(12) United States Patent
Lin et al.

(10) Patent No.: US 11,609,815 B1
(45) Date of Patent: Mar. 21, 2023

(54) SEMICODUCTOR DEVICE AND OPERATION METHOD THEREOF

(71) Applicant: TAIWAN SEMICONDUCTOR MANUFACTURING COMPANY, LTD., Hsinchu (TW)

(72) Inventors: Zheng-Jun Lin, Taichung (TW); Pei-Ling Tseng, Miaoli County (TW); Hsueh-Chih Yang, Hsinchu (TW); Chung-Cheng Chou, Hsinchu (TW); Yu-Der Chih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 24 days.

(21) Appl. No.: 17/461,532

(22) Filed: Aug. 30, 2021

(51) Int. Cl.
*G06F 11/10* (2006.01)
*G11C 7/10* (2006.01)
*H03K 19/20* (2006.01)

(52) U.S. Cl.
CPC ........ *G06F 11/1068* (2013.01); *G11C 7/1096* (2013.01); *H03K 19/20* (2013.01)

(58) Field of Classification Search
CPC .... G06F 11/1068; G11C 7/1096; H03K 19/20
See application file for complete search history.

(56) References Cited

U.S. PATENT DOCUMENTS

2006/0245253 A1* 11/2006 Hebishima ......... G11C 16/3459
365/185.18
2017/0024273 A1* 1/2017 Han ...................... G06F 11/073

\* cited by examiner

*Primary Examiner* — Kyle Vallecillo
(74) *Attorney, Agent, or Firm* — Birch, Stewart, Kolasch & Birch, LLP (57) ABSTRACT

A semiconductor device includes a memory circuit, an error correction code circuit, a register circuit and a write circuit. The memory circuit is configured to output, in response to at least one address signal, first data associated with at least one memory cell in the memory circuit. The error correction code circuit is configured to convert the first data to second data and configured to generate error information when the first data is not identical to the second data. The register circuit is configured to output, based on the error information, reset information corresponding to the at least one address signal. The write circuit is configured to reset the at least one memory cell according to the reset information. A method is also disclosed herein.

20 Claims, 5 Drawing Sheets

SEMICODUCTOR DEVICE AND OPERATION METHOD THEREOF

BACKGROUND

Memory cells typically include, for example, resistive random access memory (RRAM), magnetoresistive random access memory (MRAM) and/or flash memory. In read operation of the memory cells, read disturb effect is usually generated based on various conditions. Generally, read disturb effect of the memory cells may get worse under some process voltage temperature (PVT) conditions. For example, higher read voltage levels and/or higher operation temperatures increase read disturb effect. The read disturb effect induces data loss issue and failed read operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, materials, values, steps, arrangements or the like are described below to simplify the present disclosure. These are, of course, merely examples and are not intended to be limiting. Other components, materials, values, steps, arrangements or the like are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. The term mask, photolithographic mask, photomask and reticle are used to refer to the same item.

The terms applied throughout the following descriptions and claims generally have their ordinary meanings clearly established in the art or in the specific context where each term is used. Those of ordinary skill in the art will appreciate that a component or process may be referred to by different names. Numerous different embodiments detailed in this specification are illustrative only, and in no way limits the scope and spirit of the disclosure or of any exemplified term.

It is worth noting that the terms such as "first" and "second" used herein to describe various elements or processes aim to distinguish one element or process from another. However, the elements, processes and the sequences thereof should not be limited by these terms. For example, a first element could be termed as a second element, and a second element could be similarly termed as a first element without departing from the scope of the present disclosure.

In the following discussion and in the claims, the terms "comprising," "including," "containing," "having," "involving," and the like are to be understood to be open-ended, that is, to be construed as including but not limited to. As used herein, instead of being mutually exclusive, the term "and/or" includes any of the associated listed items and all combinations of one or more of the associated listed items.

Figure 1:
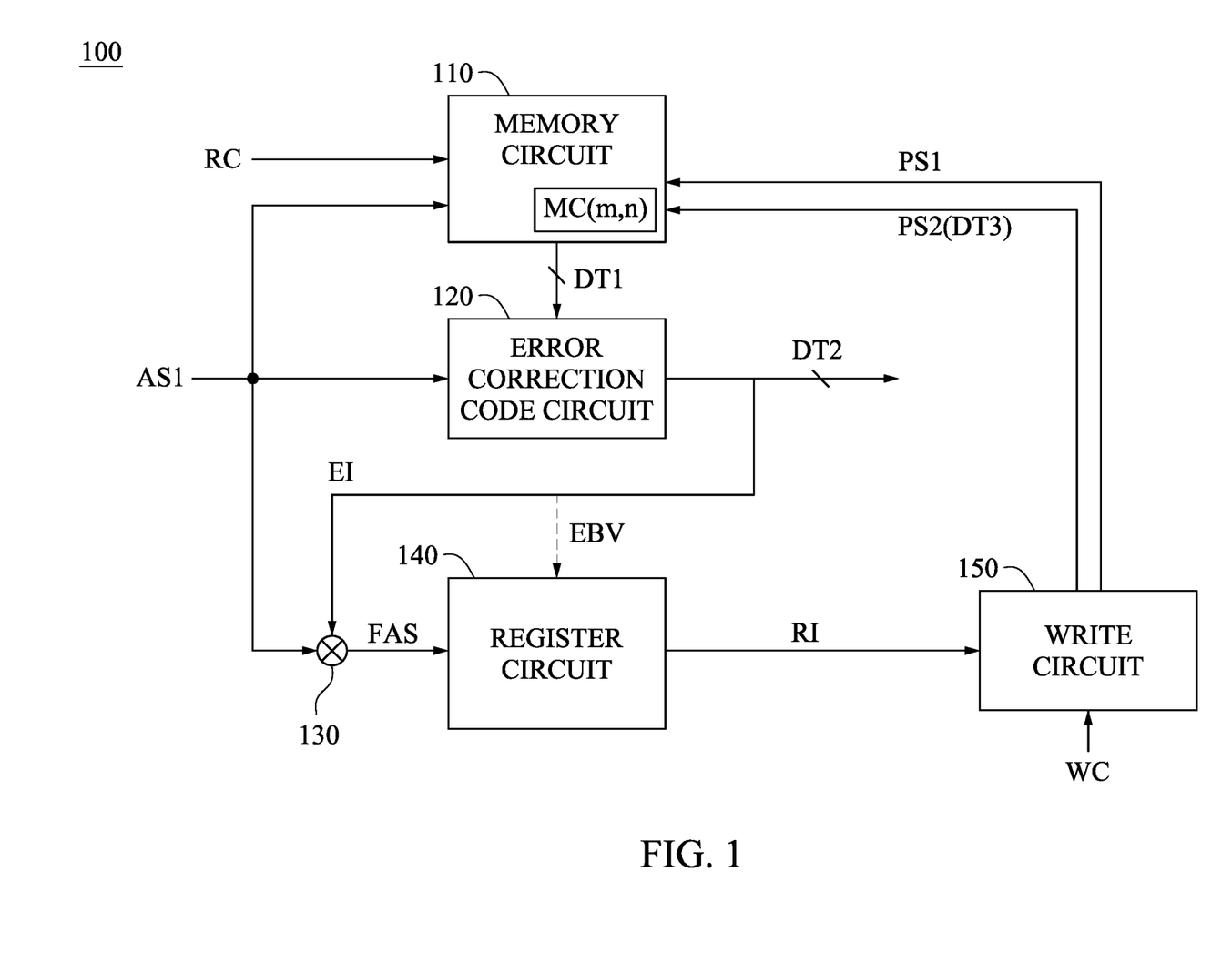
FIG. 1 is a schematic diagram of a semiconductor device in accordance with some embodiments of the present disclosure.

FIG. 1 is a schematic diagram of a semiconductor device 100 in accordance with some embodiments of the present disclosure. As illustratively shown in FIG. 1, a semiconductor device 100 includes a memory circuit 110, an error correction code circuit 120, a logic circuit 130, a register circuit 140 and a write circuit 150.

Figure 5:
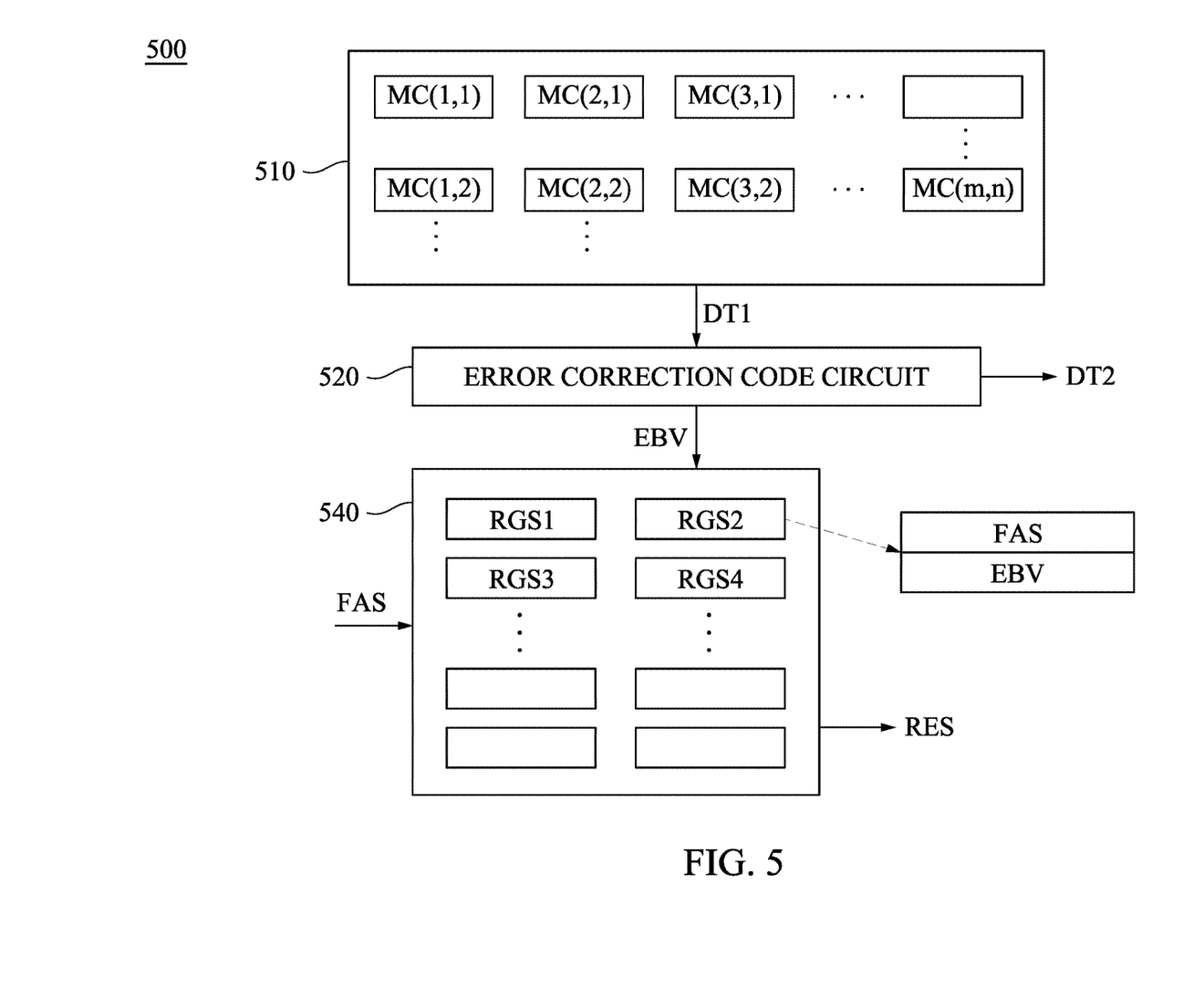
FIG. 5 is a schematic diagram of a semiconductor device in accordance with some embodiments of the present disclosure.

In some embodiments, the memory circuit 110 is configured to receive a read command RC and an address signal AS1, and configured to output data DT1 according to the read command RC and the address signal AS1. As illustratively shown in FIG. 1, the memory circuit 110 includes memory cells (as shown in FIG. 5) which are collectively indicated by a memory cell MC(m, n) for sake of simplicity. In some embodiments, a read operation of the memory cell MC(m, n) is activated by the read command RC, in order to output the data DT1 from the memory circuit 110. In some embodiments, the address signal AS1 corresponds to an address (m, n) indicating a location of the memory cell MC(m, n) in the memory circuit 110. In some embodiments, the memory circuit 110 receives various address signals corresponding to various memory cells, in order to output corresponding data.

In some embodiments, as illustratively shown in FIG. 1, the error correction code circuit 120 is configured to receive the data DT1 and the at least one address signal AS1 and configured to generate data DT2 when the data DT1 is not identical to the data DT2. In some embodiments, the memory cell MC(m, n) is required to store the data DT2, but with read disturb effect, the memory cell MC(m, n) stores the data DT1 which is incorrect. For example, the memory cell MC(m, n) stores the data DT1 which is not the same as the data DT2 being required. The error correction code circuit 120 is configured to detect and fix the incorrectness of the data DT1 to generate the data DT2 which is correct, correspondingly. In other words, the error correction code circuit 120 is configured to convert the data DT1 to the data DT2 when the data DT1 is not identical to the data DT2.

In some embodiments, the error correction code circuit 120 is configured to generate error information EI when the data DT1 is not identical to the data DT2. The error information EI indicates that an error occurs in the memory cell MC(m, n). In some embodiments, the error is due to the read disturb effect and referred to as a read disturb error which causes that the data DT1 is not identical to the data DT2. In some embodiments, when the data DT1 is not identical to the data DT2, the error information EI has a logic high state (i.e., logic "1"), and the error correction code circuit 120 is configured to activate a logic circuit 130 by the error information EI.

In some further embodiments, the error correction code circuit 120 is configured to generate at least one error bit value EBV. The at least one error bit value EBV indicates which bit(s) of the data DT1 is incorrect. In some embodiments, the at least one error bit value EBV indicates which bit(s) of the data DT1 is not identical to the corresponding bit(s) of the data DT2.

For example, the data DT1 has four bits "1101", in which the fourth bit is incorrect due to a read disturb error. The data DT2 having four bits "1100" is correct. The difference between the data DT1 and the data DT2 is associated with the fourth bit. Therefore, the error bit value EBV is "0001" indicating that the error occurs at the fourth bit of the data DT1. In some embodiments, the error correction code circuit 120 is configured to receive the data DT1 (i.e., "1101"), and configured to generate the data DT2 (i.e., "1100") and generate the error bit value EBV (i.e., "0001") based on the difference between the data DT1 and the data DT2.

In some embodiments, as illustratively shown in FIG. 1, the logic circuit 130 is configured to receive the at least one address signal AS1 and the error information EI, and output, in response to the error information EI, a fail address signal FAS to the register circuit 140. The logic circuit 130, the memory circuit 110 and the error correction code circuit 120 are configured to operate in response to the address signal AS1. When the memory circuit 110 outputs the data DT1 in response to the at least one address signal AS1 and the error correction code circuit 120 detects an error of the data DT1, the logic circuit 130 receives the error information EI generated by the error correction code circuit 120 correspondingly.

In some embodiments, the fail address signal FAS corresponds to the address (m, n) of the memory cell MC(m, n) storing the data DT1. Alternatively stated, when an error occurs in the memory cell MC(m, n) located at the address (m, n), the logic circuit 130 outputs the fail address signal FAS corresponding to the address (m, n).

In some embodiments, as illustratively shown in FIG. 1, the register circuit 140 is configured to store the at least one fail address signal FAS and configured to generate reset information RI according to the at least one fail address signal FAS.

In further embodiments, the register circuit 140 is configured to store the error bit value EBV provided by the error correction code circuit 120, and configured to output signals according to the error bit value EBV. Further details are described below in embodiments with reference to FIG. 4 and FIG. 5.

In some embodiments, as illustratively shown in FIG. 1, the write circuit 150 is configured to reset the memory cell MC(m, n) according to the reset information RI. The reset information RI corresponds to the address (m, n) of the memory cell MC(m, n). In some other embodiments, the write circuit 150 is configured to reset various memory cells of the memory circuit 110 when the reset information RI corresponds to the various memory cells which store the corresponding data.

In some embodiments, the write circuit 150 is configured to reset the memory cell MC(m, n) by transmitting a pulse signal PS1 to write the memory cell MC(m, n) to an initial state. For example, the data DT1 stored in the memory cell MC(m, n) corresponds to "1101" and a current state, while the data DT2 output from the error correction code circuit 120 corresponds to "1100" and the initial state. When the write circuit 150 transmits the pulse signal PS1 to reset the memory cell MC(m, n), the memory cell MC(m, n) is written from the current state (or "1101") to the initial state (or "1100"). As a result, the error of the memory cell MC(m, n) is fixed.

In some embodiments, in addition to the reset operation as discussed above, the write circuit 150 is further configured to write data DT3 into the memory circuit 110 in response to a write command WC. In some embodiments, the write circuit 150 is configured to transmit a pulse signal PS2 to the memory circuit 110 to write the data DT3. The pulse signal PS2 is different from the pulse signal PS1. The difference between the pulse signals PS2 and PS1 is described below in embodiments with reference to FIG. 2A and FIG. 2B.

The above configuration of the semiconductor device 100 is given for illustrative purposes. Various configurations of the semiconductor device 100 are within the contemplated scope of the present disclosure. For example, in various embodiments, the semiconductor device 100 includes two write circuits configured to provide the pulse signals PS2 and PS1, respectively. For another example, in alternative embodiments, the write circuit 150 does not output the pulse signal PS2 for writing data into the memory circuit 110. For still another example, in various embodiments, the semiconductor device 100 further includes a hard error register circuit (not shown). The hard error register circuit is configured to store addresses of memory cells that have errors caused by hardware defects of the memory circuit 110. The write circuit 150 is not able to fix the hardware defects by the pulse signal PS1. Therefore, when an error of the memory circuit 110 is due to the hardware defects, the write circuit 150 does not perform the reset operation as described above. In various embodiments, the hard error register circuit as discussed above is included in the error correction code circuit 120, the register circuit 140, or the combination thereof.

Figure 2A:
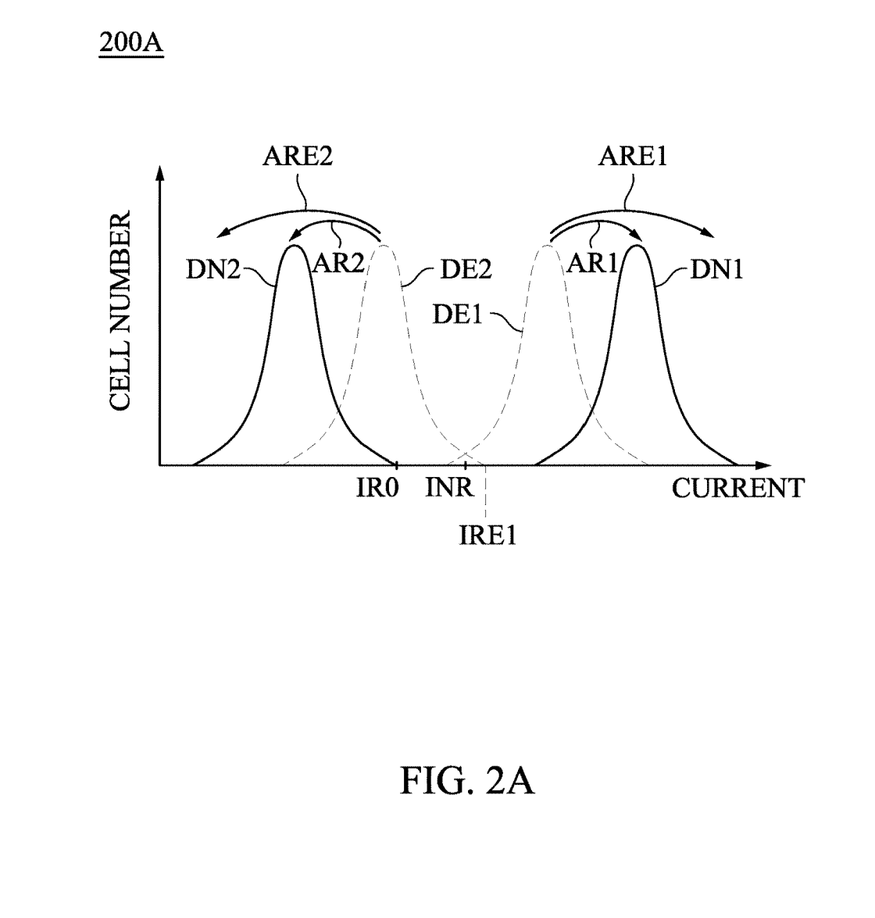
FIG. 2A is a schematic diagram of distribution curves of current levels of memory circuit in FIG. 1, in accordance with some embodiments of the present disclosure.

FIG. 2A is a schematic diagram of distribution curves of current levels of memory circuit 110 in FIG. 1, in accordance with some embodiments of the present disclosure. As illustratively shown in FIG. 2A, a diagram 200A includes a horizontal axis corresponding to current levels of currents passing through the memory cells of the memory circuit 110, and a vertical axis corresponding to numbers of memory cells having the current levels corresponding to the horizontal axis.

In some embodiments, the data stored in the memory cells of the memory circuit 110 is evaluated according to the current levels of currents passing through each of the memory cells. Memory cells having current levels higher than a current level INR correspond to a low resistant state. Memory cells having current levels lower than a current level INR correspond to a high resistant state. In some embodiments, the memory cells with low resistant state store data with logic "1", and the memory cells with high resistant state store data with logic "0".

As illustratively shown in FIG. 2A, the diagram 200A includes distribution curves DN1, DN2, DE1 and DE2. The distribution curves DN1 and DN2 correspond to distributions of memory cells of the memory circuit 110 storing data with logic "1" and logic "0", respectively. Current levels of the memory cells of distribution curves DN1 are higher than the current level INR. Current levels of the memory cells of distribution curves DN2 are lower than the current level INR.

When a read disturb error occurs, the current levels of the memory cells of with logic "1" are decreased, and thus the distribution curve DN1 moves leftward becoming the distribution curve DE1. Similarly, the current levels of the memory cells with logic "0" are increased, and thus the distribution curve DN2 moves rightward becoming the distribution curve DE2. As illustratively shown in FIG. 2A, a part of the memory cells of the distribution curve DE1 have current levels lower than the current level INR, such that data storing in these memory cells are read as logic "0" which is incorrect. Similarly, some of the memory cells of the distribution curve DE2 have current levels higher than the current level INR, such that data storing in these memory cells are read as logic "1" which is incorrect.

For example, at first, the memory cell MC(m, n) has a current level IR0. Correspondingly, the memory cell MC(m, n) stores the data DT1 with logic "0". Then, when a read disturb error occurs, the distribution curve DN2 of the memory cells moves rightward, and the memory cell MC(m, n) has a current level IRE1. Correspondingly, the data DT1 becomes having logic "1" which is incorrect.

In some embodiments, the write circuit 150 is configured to reset the memory cells with the distribution curves DE1 and DE2 to the distribution curves DN1 and DN2, respectively. The write circuit 150 is configured to reset the memory cells by transmitting the pulse signal PS1 to the memory cells. The reset operation corresponds to the arrows AR1 and AR2 as illustratively shown in FIG. 2A. Further details of the reset operation are described below in embodiments with reference to FIG. 2B.

Figure 2B:
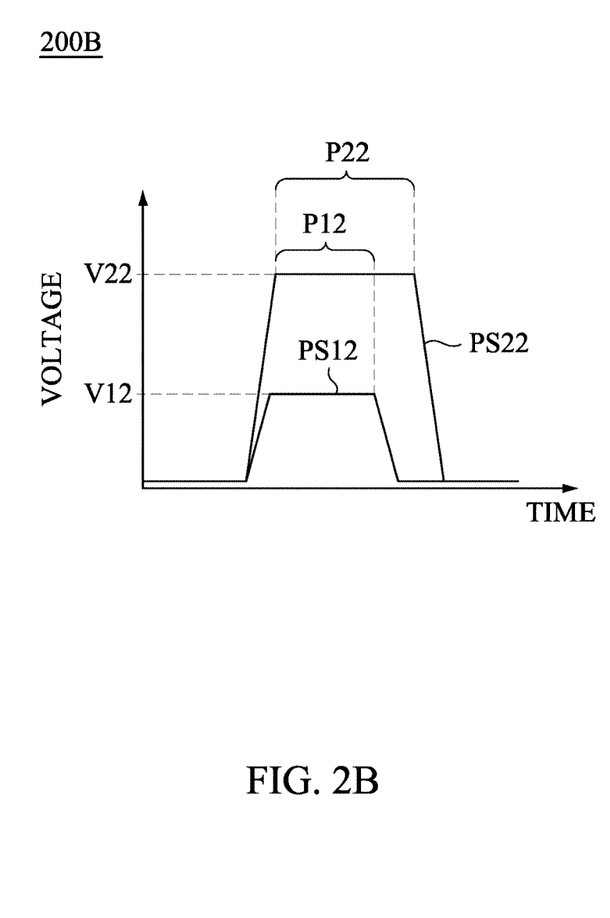
FIG. 2B is a schematic diagram of waveforms of pulse signals outputted by the write circuit in FIG. 1, in accordance with some embodiments of the present disclosure.

FIG. 2B is a schematic diagram of waveforms of pulse signals outputted by the write circuit 150 shown in FIG. 1, in accordance with some embodiments of the present disclosure. As illustratively shown in FIG. 2B, a diagram 200B includes a horizontal axis corresponding to time and a vertical axis corresponding to voltage levels of pulse signals provided by the write circuit 150.

As illustratively shown in FIG. 2B, a diagram 200B illustrates voltage levels of pulse signals PS12 and PS22. The pulse signal PS12 is an embodiment of the pulse signal PS1 which is for resetting the memory cell MC(m, n). The pulse signal PS22 is an embodiment of the pulse signal PS2 which is for writing data DT3 into the memory cell MC(m, n). The above configuration of the pulse signals PS12 and PS22 is given for illustrative purposes. Various configuration of the pulse signals PS12 and PS22 are within the contemplated scope of the present disclosure.

As illustratively shown in FIG. 2B, the pulse signal PS12 has a voltage level V12 during a time period P12. The pulse signal PS22 has a voltage level V22 during a time period P22. The voltage level V12 is lower than the voltage level V22 and the time period P12 is shorter than the time period P22, such that effects of the pulse signal PS12 is smaller than effects of the pulse signal PS22 to the memory cell MC(m, n). More details are described below. In various embodiments, the voltage level V12 is lower than the voltage level V22 or the time period P12 is shorter than the time period P22.

In some previous approaches, the write circuit resets a memory cell and writes data into the memory cell using pulse signals with same voltage level and same time period holding the voltage level. The pulse signal for the write operation is too strong for the reset operation, such that the memory cell is over-reset. For illustration of FIG. 2B with reference to FIG. 2A, the over reset operations are corresponding to arrows ARE1 and ARE2. When the pulse signal PS22 is applied to the memory cells with the distribution curves DE1 and/or DE2 for the reset operation, the distribution of the memory cells moves along the arrows ARE1 and/or ARE2. Correspondingly, the current levels of the distribution curve DE2 decrease too much and/or the current levels of the distribution curve DE1 increase too much, such that the memory cells may be damaged.

Compared to the above approaches, in some embodiments of the present disclosure, the pulse signal PS12 has a lower voltage level V12 and/or shorter time period holding the voltage level V12. The pulse signal PS12 is transmitted to the memory cell MC(m, n) for the reset operation corresponding to the arrow AR2, such that the memory cell MC(m, n) is not damaged by the pulse signal PS12.

Figure 3:
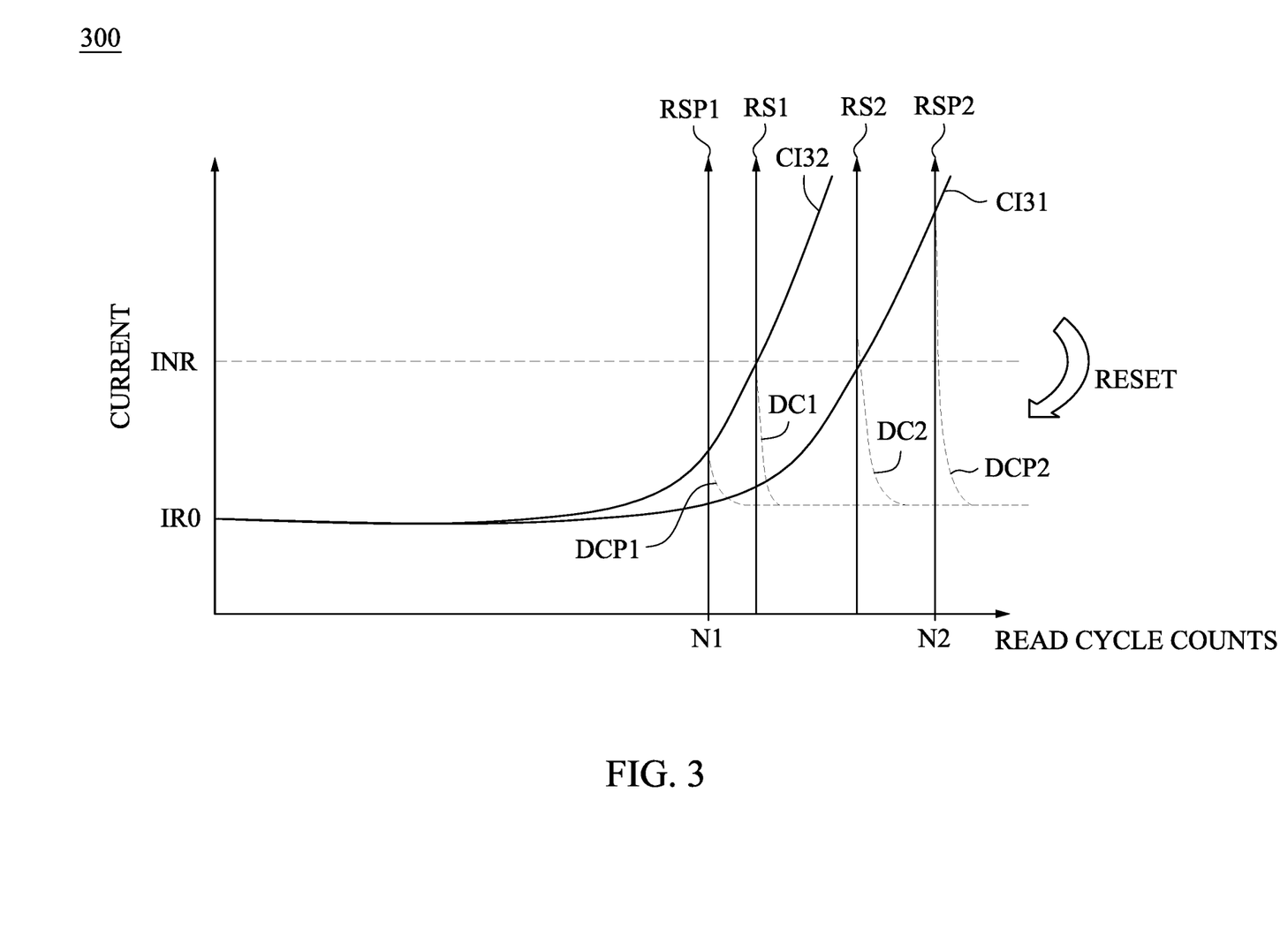
FIG. 3 is a schematic diagram of current levels of the memory cell with respect to read cycle counts of the memory circuit, in accordance with some embodiments of the present disclosure.

FIG. 3 is a schematic diagram of current levels of the memory cell with respect to read cycle counts of the memory circuit, in accordance with some embodiments of the present disclosure. As illustratively shown in FIG. 3, a diagram 300 includes a horizontal axis corresponding to read cycle counts of the memory circuit 110 and a vertical axis corresponding to current levels of the memory cell MC(m, n). The read cycle counts indicate times that the memory circuit 110 is read.

As illustratively shown in FIG. 3, a diagram 300 includes curves CI31 and CI32. The curves CI31 and CI32 indicates the current level of the memory cell MC(m, n). The curves CI31 and CI32 are corresponding to different process voltage temperature (PVT) conditions of the memory cell MC(m, n). The current level of the memory cell MC(m, n) is effected by the PVT conditions. Comparing to the curve CI31, the curve CI32 has worse PVT conditions, such that the current level of the curve CI32 increases faster than that of the curve CI31. For example, the curve CI32 corresponds to higher environment temperature and/or higher read voltage than that of the curve CI31.

In the example shown in FIG. 3, at first, the memory cell MC(m, n) is configured to store the data DT1 with logic "0", and thus the memory cell MC(m, n) has the current level IR0 corresponding to logic "0". As the read cycle counts increased, the read disturb errors occur. The current level of the memory cell MC(m, n) is increased due to the read disturb errors. When the current level of the memory cell MC(m, n) exceeds the current level INR, the data DT1 is read as logic "1" which is incorrect. The reset operation described in FIG. 2B is performed to fix the incorrectness.

As illustratively shown in FIG. 3, a diagram 300 includes reset operations RSP1, RSP2, RS1 and RS2. When the reset operations RSP1, RSP2, RS1 and RS2 are performed, the current level of the memory cell MC(m, n) is decreased to the current level IR0 along dot curves DCP1, DCP2, DC1 and DC2, respectively.

In some previous approaches, the reset operations are performed periodically. In other words, the rest operations are performed whenever the memory cell is read for a certain number of times. For example, the reset operation RSP1 is performed once per N1 read cycle counts, and the reset operation RSP2 is performed once per N2 read cycle counts as illustratively shown in FIG. 3. N1 and N2 are positive integers. N2 is larger than N1. As illustratively shown in FIG. 3, the reset operation RSP1 is performed when the current level of the memory cell MC(m, n) is still lower than the current level INR. The reset operation RSP1 is performed when the data stored in the memory cell MC(m, n) is still correct. Therefore, the reset operation RSP1 is performed too frequently, and the memory cell MC(m, n) is damaged due to the reset operation RSP1. On the other hand, the reset operation RSP1 is performed after the current level of the memory cell MC(m, n) exceeding the current level INR for some read cycles counts, which leads to read fail issues.

Compared to the above approaches, in some embodiments of the present disclosure, the reset operations RS1 and RS2 are performed at moments that the current level of the memory cell MC(m, n) just exceeds the current level INR. When the current level exceeds the current level INR, the data DT1 has an error, and the error correction code circuit 120 detects the error and provides the error information EI for the write circuit 150 to reset the memory cell MC(m, n). Therefore, the frequencies of the reset operations RS1 and RS2 are the frequencies for avoiding read fail issues. The reset operations RS1 and RS2 correspond to the curves CI31 and CI32, respectively. The reset operations RS1 and RS2 are adaptive for the curves CI31 and CI32 under different PVT conditions.

Figure 4:
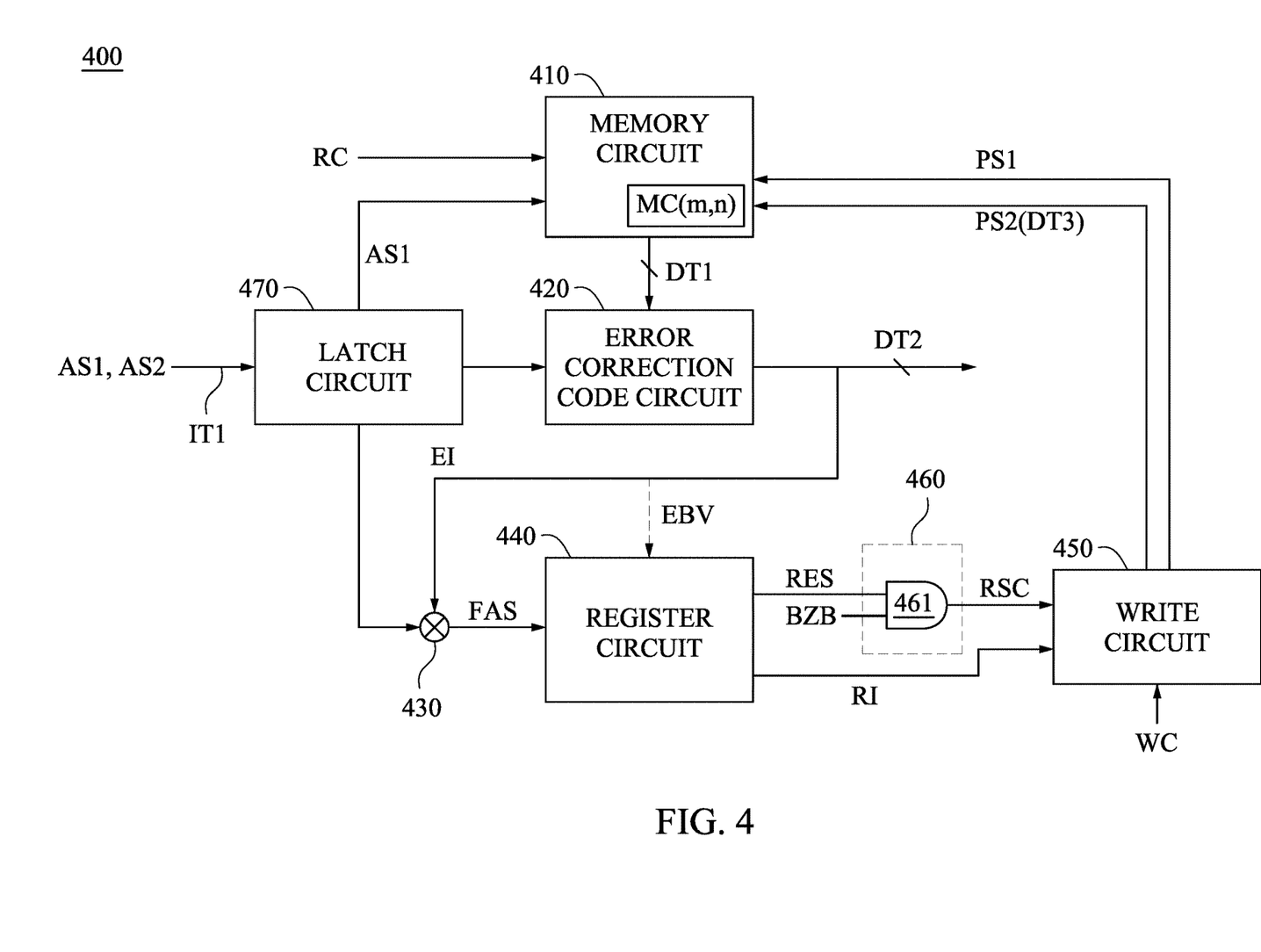
FIG. 4 is a schematic diagram of a semiconductor device in accordance with some embodiments of the present disclosure.

FIG. 4 is a schematic diagram of a semiconductor device 400 in accordance with some embodiments of the present disclosure. As illustratively shown in FIG. 4, a semiconductor device 400 includes a memory circuit 410, an error correction code circuit 420, a logic circuit 430, a register circuit 440, a write circuit 450, a logic circuit 460 and a latch circuit 470. Operations and configurations of the memory circuit 410, the error correction code circuit 420, the logic circuit 430, the register circuit 440 and the write circuit 450 are similar to that of the memory circuit 110, the error correction code circuit 120, the logic circuit 130, the register circuit 140 and the write circuit 150. Therefore, some descriptions are not repeated in embodiments associated with FIG. 4 for brevity.

In some embodiments, as illustratively shown in FIG. 4, the latch circuit 470 is configured to receive the address signal AS1 at the input terminal IT1 of the latch circuit 470, and configured to transmit the address signal AS1 to each of the memory circuit 410, the error correction code circuit 420 and the logic circuit 430. In some embodiments, the latch circuit 470 is configured to store the address signal AS1 when an address signal AS2 is provided to the input terminal IT1. The address signal AS2 is different from the address signal AS1.

As illustratively shown in FIG. 4, the register circuit 440 is configured to generate the reset information RI according to the fail address signal FAS. In some embodiments, the register circuit 440 is further configured to generate a reset enable signal RES. In some embodiments, the write circuit 450 is configured to be activated by the reset enable signal RES to reset the memory cell MC(m, n) of the memory circuit 410.

In some embodiments, the register circuit 440 is configured to generate the reset enable signal RES when a number of the fail address signal FAS storing in the register circuit 440 is larger than a preset number. In some embodiments, the register circuit 440 is configured to generate the reset enable signal RES when a number of incorrect bits of the data DT1 is larger than or equal to an error limit number of the error correction code circuit 420. Further details are described below in embodiments with reference to FIG. 5.

In some embodiments, as illustratively shown in FIG. 4, the logic circuit 460 is configured to output a reset command RSC according to the reset enable signal RES and a write signal BZB. The write circuit 450 is configured to be activated by the reset command RSC to reset the memory cell MC(m, n).

In some embodiments, the write signal BZB is associated with the write operation of the write circuit 450 which writes the data DT3 into the memory circuit 410. The write circuit 450 is configured to perform the read operation and the reset operation at different times. The logic circuit 460 is configured to control the write circuit 450 by the reset command RSC in response to the write signal BZB, such that the write circuit 450 performs the reset operation when the write operation is not performed. In some embodiments, the write signal BZB is the complementary of the write command WC.

In some previous approaches, the write circuit performs the read operation and the reset operation simultaneously, which leads to operation conflicts. Compared to the above approaches, in some embodiments of the present disclosure, the write circuit 450 is configured to perform the read operation and the reset operation separately to avoid the operation conflicts.

As illustratively shown in FIG. 4, the logic circuit 460 includes a AND gate 461. The AND gate 461 is configured to output the reset command RSC to the write circuit 450. The write circuit 450 is configured be activated by the reset command RSC to reset the memory cell MC(m, n) of the memory circuit 410. Input terminals of the AND gate 461 is configured to receive the reset enable signal RES and the write signal BZB.

For example, the write signal BZB has logic "1" state when the write circuit 450 stops to write the data DT3 into the memory circuit 410, such that the reset command RSC has logic "1" state to activate the reset operation of the write circuit 450 when write circuit 450 writes no data into the memory circuit 410. The above configuration of the logic circuit 460 is given for illustrative purposes. In various embodiments, the logic circuit 460 includes logic elements other than the AND gate 461, such as inverter, NAND gate, OR gate and others. Various logic elements and combination thereof included in the logic circuit 460 are within the contemplated scope of the present disclosure.

FIG. 5 is a schematic diagram of a semiconductor device 500 in accordance with some embodiments of the present disclosure. As illustratively shown in FIG. 5, a semiconductor device 500 includes a memory circuit 510, an error correction code circuit 520 and a register circuit 540. The memory circuit 510, the error correction code circuit 520 and the register circuit 540 are embodiments of the memory circuit 410, the error correction code circuit 420 and the register circuit 440 shown in FIG. 4, respectively.

As illustratively shown in FIG. 5, the memory circuit 510 includes memory cells MC(1, 1), MC(1, 2), . . . , MC(2, 1), MC(2, 2), . . . , MC(m, n), in which m and n are positive integers labeling a position of the memory cell MC(m, n) in the memory circuit 510. In other words, the memory cell MC(m, n) is located at the address (m, n) of the memory circuit 510. When the address signal AS1 corresponds to the address (m, n), the memory circuit 510 output the data DT1 stored in the memory cell MC(m, n) in response to the address signal AS1.

In some embodiments, as illustratively shown in FIG. 5, the error correction code circuit 520 is configured to generate data DT2 and error bit value EBV when the data DT1 is not identical to the data DT2. In some embodiments, the error correction code circuit 520 is able to generate the data DT2 when a number of incorrect bits of the data DT1 is smaller than or equal to an error limit number of the error correction code circuit 520. The incorrect bits of the data DT1 are the bits that are different from corresponding bits of the data DT2. The error limit number corresponds to a maximum number of incorrect bits that the error correction code circuit 520 is able to fix. In other words, the error correction code circuit 520 is not able to generate the data DT2 when the number of the incorrect bits of the data DT1 exceeds the error limit number.

In some embodiments, as illustratively shown in FIG. 5, the register circuit 540 includes registers RGS1-RGS4. Each of the registers RGS1-RGS4 is configured to store a fail address signal FAS and the error bit value EBV of an incorrect bit of a memory cell of the memory circuit 510. In some embodiments, the fail address signals FAS and the error bit values EBV stored in the registers RGS1-RGS4 indicate the number of the incorrect bits of the memory cell.

In some embodiments, the register circuit 540 is configured to generate the reset enable signal RES when the number of the incorrect bits is larger than or equal to the error limit number. A write circuit (i.e., the write circuit 450) is configured to be activated by the reset enable signal RES to reset the memory cell MC(m, n).

An example that the error limit number being two is described following. In this example, at first, a read disturb error occurs, and the data DT1 stored in the memory cell MC(m, n) has a value "1101" different from a value "1100" of the data DT2. The error bit value EBV "0001" indicates that the fourth bit is incorrect. The register RGS1 stores "FAS=(m, n), EBV="0001"". The number of the incorrect bit is one, which is smaller than the error limit number. The write circuit does not reset the memory cell MC(m, n) in response to the error bit value EBV because the error correction code circuit 520 is able to fix the data DT1. Correspondingly, the register circuit 540 generates the reset enable signal RES having a logic "0" state.

Then, another read disturb error occurs, causing that the data DT1 has a value 1001 with two incorrect bits. The corresponding error bit value EBV is "0101" indicating that the fourth and the second bits are incorrect. The corresponding fail address signal FAS and the corresponding error bit value EBV are provided to the register RGS2, and thus the register RGS2 stores "FAS=(m, n), EBV="0101"". The number of incorrect bits is two, which is equal to the error limit number. The write circuit resets the memory cell MC(m, n) because the error correction code circuit 520 is not able to fix the data DT1 if another error occurs. Correspondingly, the register circuit 540 generates the reset enable signal RES having a logic "1" state to activate the reset operation to reset the memory cell MC(m, n).

For illustration of FIG. 5 with reference to FIG. 4, the inputs terminals of the AND gate 461 is configured to receive the reset enable signal RES and the write signal BZB. When the write circuit 450 writes no data into the memory circuit 410 and the number of incorrect bits is equal to the error limit number, the reset enable signal RES and the write signal BZB have logic "1" state. Correspondingly, the AND gate 461 outputs the reset command RSC having logic "1" state to the write circuit 450 to activate the reset operation.

In some embodiments, the number of the registers of the register circuit 540 is configurable for different applications of the memory circuit 510. In various embodiments, the memory circuit 510 has various applications.

In some embodiments, the memory circuit 510 is configured for code usage. The memory cell MC(1, 1) stores a code or a decoder, such that the memory cell MC(1, 1) is heavily read comparing to other memory cells. The read disturb errors are more likely to occur at the memory cell MC(1, 1) comparing to other memory cells. In such embodiments, a number of the registers of the register circuit 540 is small, because the register circuit 540 just need to store errors of the memory cell MC(1, 1) in most of the cases.

In some other embodiments, the memory circuit 510 is configured for data usage. Each of the memory cells MC(1, 1), . . . , MC(m, n) are read averagely. The read disturb errors occur averagely for each of the memory cells MC(1, 1), . . . , MC(m, n). In such embodiments, a number of the registers of the register circuit 540 is larger than the code usage cases described above, because the register circuit 540 needs to store errors of more memory cells.

In some embodiments, the number of the registers is increased in a fabricating process corresponding to the usage of the register circuit 540. In some embodiments, the number of the registers is evaluated according to read frequency of each of the memory cells, and the registers are fabricated according to the number of the registers.

In some other embodiments, the number of the registers is increased or decreased by activating or deactivating the registers of the register circuit 540 for the reset operation. More specifically, when the usage of the memory circuit 510 induces more fail address signals FAS which need to be stored, some registers of the register circuit 540 are activated. In contrast, when the usage of the memory circuit 510 induces few fail address signals FAS, some registers of the register circuit 540 are deactivated for the reset operation. Those deactivated registers are configured for other functions in some embodiments.

For example, when the memory circuit 510 is configured for the code usage and store a decoder in the memory cell MC(1, 1), the memory cell MC(1, 1) is heavily read. Correspondingly, the register RSG1 is activated for storing a fail address signal FAS corresponding to the address (1, 1), and the registers RSG2-RSG4 are deactivated. When the memory circuit 510 is configured for the data usage and store data in the memory cells MC(1, 1), MC(1, 2), MC(2, 1) and MC(2, 2). Correspondingly, the registers RSG1-RSG4 are activated for storing fail address signals FAS corresponding to the addresses (1, 1), (1, 2), (2, 1) and (2, 2).

With respect to the devices 100, 400 and 500 in FIG. 1, FIG. 4 and FIG. 5, the read disturb error of the memory cell MC(m, n) is fixed when the error correction code circuits 120, 420 and 520 detect the read disturb errors. With respect to the diagram 200B in FIG. 2B, the memory cell MC(m, n) is not damaged by the pulse signal PS12 having the lower voltage level V22 and/or the shorter time period P12. With respect to the semiconductor device 500 in FIG. 5, a number of the registers of the register circuit 540 is configurable according to applications of the memory circuit 510.

Also disclosed is a device that includes a memory circuit, an error correction code circuit, a register circuit and a write circuit. The memory circuit is configured to output, in response to at least one address signal, first data associated with at least one memory cell in the memory circuit. The error correction code circuit is configured to convert the first data to second data and configured to generate error information when the first data is not identical to the second data.

The register circuit is configured to output, based on the error information, reset information corresponding to the at least one address signal. The write circuit is configured to reset the at least one memory cell according to the reset information.

Also disclosed is a method that includes: outputting, from a memory circuit, in response to at least one address signal, first data associated with at least one memory cell in the memory circuit; generating second data and error information based on the first data when the first data is not identical to the second data; generating reset information corresponding to the at least one address signal; transmitting a first pulse signal from a write circuit to the at least one memory cell according to the reset information; resetting the at least one memory cell to an initial state according to the first pulse signal; receiving, by the memory circuit, a second pulse signal to write third data into the memory circuit when the first pulse signal is not transmitted to the at least one memory cell. The second pulse signal has a voltage level higher than a voltage level of the first pulse signal.

Also disclosed is a device that includes a memory circuit, an error correction code circuit, a first logic circuit, a register circuit, a write circuit and a second logic circuit. The memory circuit is configured to output, in response to at least one address signal, first data associated with at least one memory cell in the memory circuit. The error correction code circuit is configured to generate error information and second data based on the first data when the first data is not identical to the second data. The first logic circuit is configured to transmit at least one fail address signal to the register circuit based on the error information and the at least one address signal. The register circuit is configured to generate reset information corresponding to the at least one fail address signal. The write circuit is configured to reset the at least one memory cell to an initial state according to the reset information and a reset command, and configured to write third data into the memory circuit when the write circuit stops to reset the at least one memory cell to the initial state. The second logic circuit is configured to generate the reset command when the write circuit writes no data into the memory circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a memory circuit configured to output, in response to at least one address signal, first data associated with at least one memory cell in the memory circuit;
   an error correction code circuit configured to convert the first data to second data and configured to generate error information when the first data is not identical to the second data;
   a register circuit configured to output, based on the error information, reset information corresponding to the at least one address signal; and
   a write circuit configured to reset the at least one memory cell according to the reset information.

2. The semiconductor device of claim 1, further comprising:
   a logic circuit configured to receive the at least one address signal and the error information to output at least one fail address signal to the register circuit, for the register circuit to generate the reset information.

3. The semiconductor device of claim 1, further comprising:
   a logic circuit configured to enable the write circuit to reset the at least one memory cell, when the write circuit writes no data into the memory circuit.

4. The semiconductor device of claim 1, wherein the register circuit is further configured to store error bit values corresponding to at least one bit of the first data which is not identical to at least one bit of the second data, and
   the write circuit is configured to reset the at least one memory cell when a number of the error bit values is larger than or equal to an error limit number of the error correction code circuit.

5. The semiconductor device of claim 4, further comprising:
   a logic circuit configured to enable the write circuit to reset the at least one memory cell, when the write circuit writes no data into the memory circuit and when the number is larger than or equal to the error limit number.

6. The semiconductor device of claim 5, wherein the logic circuit comprises:
   an AND gate configured to output a reset command to the write circuit for enable the write circuit to reset the at least one memory cell, a first input terminal of the AND gate is configured to receive a reset enable signal corresponding to a comparison result between the number and the error limit number, a second input terminal of the AND gate is configured to receive a write signal corresponding to the write circuit writing no data into the memory circuit.

7. The semiconductor device of claim 1, wherein the write circuit is further configured to write third data into the memory circuit by transmitting a first pulse signal having a first voltage value to the memory circuit, and configured to reset the at least one memory cell by transmitting a second pulse signal having a second voltage value to the at least one memory cell,
   wherein the second voltage value is smaller than the first voltage value.

8. The semiconductor device of claim 7, wherein a time period of the first pulse signal having the second voltage value is shorter than a time period of the second pulse signal having the first voltage value.

9. The semiconductor device of claim 1, wherein the register circuit comprises:
   a plurality of registers configured to store fail address signals that are generated based on the at least one address signal and the error information,
   wherein a number of the plurality of registers that are configured to be activated increases when a number of the fail address signals increases.

10. A method, comprising:
    outputting, from a memory circuit, in response to at least one address signal, first data associated with at least one memory cell in the memory circuit;
    generating second data and error information based on the first data when the first data is not identical to the second data;

generating reset information corresponding to the at least one address signal;

transmitting a first pulse signal from a write circuit to the at least one memory cell according to the reset information;

resetting the at least one memory cell to an initial state according to the first pulse signal; and receiving, by the memory circuit, a second pulse signal to write third data into the memory circuit when the first pulse signal is not transmitted to the at least one memory cell, wherein the second pulse signal has a voltage level higher than a voltage level of the first pulse signal.

11. The method of claim 10, further comprising:
transmitting, in response to the error information and the at least one address signal, at least one fail address signal to a register circuit which generates the reset information.

12. The method of claim 11, further comprising:
evaluating a number of a plurality of registers of the register circuit according to read frequency of each of the at least one memory cell;
fabricating the plurality of registers according to the number; and
storing the at least one fail address signal into the plurality of registers.

13. The method of claim 10, further comprising:
resetting the at least one memory cell to the initial state when no data is written into the memory circuit.

14. The method of claim 13, further comprising:
identifying a bit number of at least one bit of the first data which is not identical to at least one bit of the second data;
comparing the bit number with an error limit number; and
resetting the at least one memory cell to the initial state when the bit number is smaller than the error limit number.

15. The method of claim 10, further comprising:
receiving a write signal corresponding to no data is written into the memory circuit;
comparing a bit number of at least one bit of the first data which is not identical to at least one bit of the second data with an error limit number;
receiving an enable signal when the bit number is larger than or equal to the error limit number;
generating a reset command according to the write signal and the enable signal; and
generating the first pulse signal according to the reset command.

16. A semiconductor device, comprising:
a memory circuit configured to output, in response to at least one address signal, first data associated with at least one memory cell in the memory circuit;
an error correction code circuit configured to generate error information and second data based on the first data when the first data is not identical to the second data;
a register circuit configured to generate reset information corresponding to at least one fail address signal;
a first logic circuit configured to transmit the at least one fail address signal to the register circuit based on the error information and the at least one address signal;
a write circuit configured to reset the at least one memory cell to an initial state according to the reset information and a reset command, and configured to write third data into the memory circuit when the write circuit stops to reset the at least one memory cell to the initial state; and
a second logic circuit configured to generate the reset command when the write circuit writes no data into the memory circuit.

17. The semiconductor device of claim 16, wherein the second logic circuit is further configured to generate the reset command when a bit number of at least one bit of the first data which is not identical to at least one bit of the second data is larger than or equal to an error limit number of the error correction code circuit.

18. The semiconductor device of claim 16, wherein the write circuit is further configured to write the third data into the memory circuit by transmitting a first pulse signal having a first voltage value to the memory circuit, and configured to write the at least one memory cell to the initial state by transmitting a second pulse signal having a second voltage value to the at least one memory cell,
wherein the second voltage value is smaller than the first voltage value, and a time period of the first pulse signal having the second voltage value is shorter than a time period of the second pulse signal having the first voltage value.

19. The semiconductor device of claim 16, wherein the register circuit comprises:
a plurality of registers configured to store the fail address signals,
wherein a number of the plurality of registers that are configured to be activated increases when a number of the fail address signals increases, and
a number of the plurality of registers that are configured to be deactivated increases when a number of the fail address signals decreases.

20. The semiconductor device of claim 16, further comprising:
a latch circuit configured to store the at least one address signal at an input terminal of the latch circuit when a signal different from the at least one address signal is provided to the input terminal.

* * * * *